(12) United States Patent
Yang et al.

(10) Patent No.: US 7,246,051 B2
(45) Date of Patent: Jul. 17, 2007

(54) METHOD FOR EXTRAPOLATING MODEL PARAMETERS OF SPICE

(75) Inventors: Gi-young Yang, Yongin (KR); Sang-hun Lee, Anyang (KR)

(73) Assignee: Samsung Electronics Co., Ltd., Suwon, Kyungki-do (KR)

( * ) Notice: Subject to any disclaimer, the term of this patent is extended or adjusted under 35 U.S.C. 154(b) by 780 days.

(21) Appl. No.: 10/102,996

(22) Filed: Mar. 22, 2002

(65) Prior Publication Data

US 2002/0165704 A1   Nov. 7, 2002

(30) Foreign Application Priority Data

Apr. 13, 2001   (KR) ............................... 2001-19947

(51) Int. Cl.
 *G06F 17/50* (2006.01)
(52) U.S. Cl. .......................................... 703/14; 702/65
(58) Field of Classification Search ................. 703/13, 703/14, 20, 22; 702/65; 700/31, 32
See application file for complete search history.

(56) References Cited

U.S. PATENT DOCUMENTS 5,790,436 A * 8/1998 Chen et al. ................... 716/5
6,356,861 B1 * 3/2002 Singhal et al. ................ 703/2
6,795,800 B1 * 9/2004 Lee .............................. 703/2
2002/0035462 A1 * 3/2002 Kidera et al. ................ 703/14

OTHER PUBLICATIONS

John W. Bandler, "Integrated Model Parameter Extraction Using Large-Scale Optimization Concepts", Dec. 12, 1998, IEEE, pp. 1629-1638, 10 pages total.*

* cited by examiner

*Primary Examiner*—Paul Rodriguez
*Assistant Examiner*—Luke Osborne
(74) *Attorney, Agent, or Firm*—Lee & Morse, P.C.

(57) ABSTRACT

An improved method for extrapolating worst-case Simulation Program with Integrated Circuit Emphasis (SPICE) model parameters for an integrated circuit including manufacturing semiconductor devices, measuring typical data and worst-case data with respect to various electrical characteristics of the manufactured devices, determining a set of typical SPICE model parameters using the typical data, and determining a set of worst-case SPICE model parameters using the typical data and the worst-case data. Determining the set of worst-case SPICE model parameters preferably includes extrapolating statistical model parameters using the typical data and the worst-case data and determining the set of worst-case SPICE model parameters using the statistical model parameters.

19 Claims, 5 Drawing Sheets

METHOD FOR EXTRAPOLATING MODEL PARAMETERS OF SPICE

BACKGROUND OF THE INVENTION

1. Field of the Invention

The present invention relates to a simulator for an integrated circuit. More particularly, the present invention relates to a method for extrapolating worst-case Simulation Program with Integrated Circuit Emphasis (SPICE) model parameters for an integrated circuit.

2. Description of the Related Art

When designing integrated circuits, most designers easily verify whether a designed circuit is capable of operating and meeting desired specifications through simulations using a representative circuit simulator such as SPICE. Moreover, as SPICE becomes more readily applied to devices having high speed and large scale, simulation of complete systems, including all designed circuits becomes simplified. Therefore, in addition to the electrical specifications of a designed circuit, recently, dispersion characteristics, which may appear in a manufactured integrated circuit, have been estimated and controlled as well.

SPICE is a program that solves equivalent equations representing the electrical characteristics of a unit device taking into consideration the number of devices used and the electrical connections among the devices. The reliability of SPICE simulation results depends on the accuracy of values of model parameters (or process parameters) included in the equivalent equations and the values of various coefficients. Accordingly, to perform a precise and estimable simulation, accurate model parameters of unit devices to be integrated on a semiconductor wafer should be provided in advance.

In extrapolating SPICE model parameters, initially, a plurality of devices are manufactured using appropriate processes. Many devices are selected from among the manufactured devices and their electrical characteristics are measured. Statistical data reflecting the electrical characteristics is prepared. Then, model parameters and coefficients of a SPICE simulator are set such that simulation results are the same as the previously prepared statistical data when devices having the same conditions (dose of a donor or acceptor, size of a transistor, thickness of silicon dioxide, resistance per one square unit, dielectric constant, and the like) as those of the manufactured devices are modeled. For example, SPICE model coefficients are set by fitting to a voltage-current characteristic curve according to a ratio of gate width to gate length of devices used during relevant processes.

Usually, as described above, model parameters may be obtained using the voltage-current characteristic curve of a device, and the reliability of a simulator is satisfactory. However, when simulating a complete system including all designed circuits as well as individual unit devices, dispersion characteristics and relationships between the individual devices and the complete system must be taken into account. In order to perform such a statistical simulation, it is necessary to provide a set of worst-case SPICE model parameters such as the threshold voltage Vth and saturation current Idsat of a device.

Figure 1:
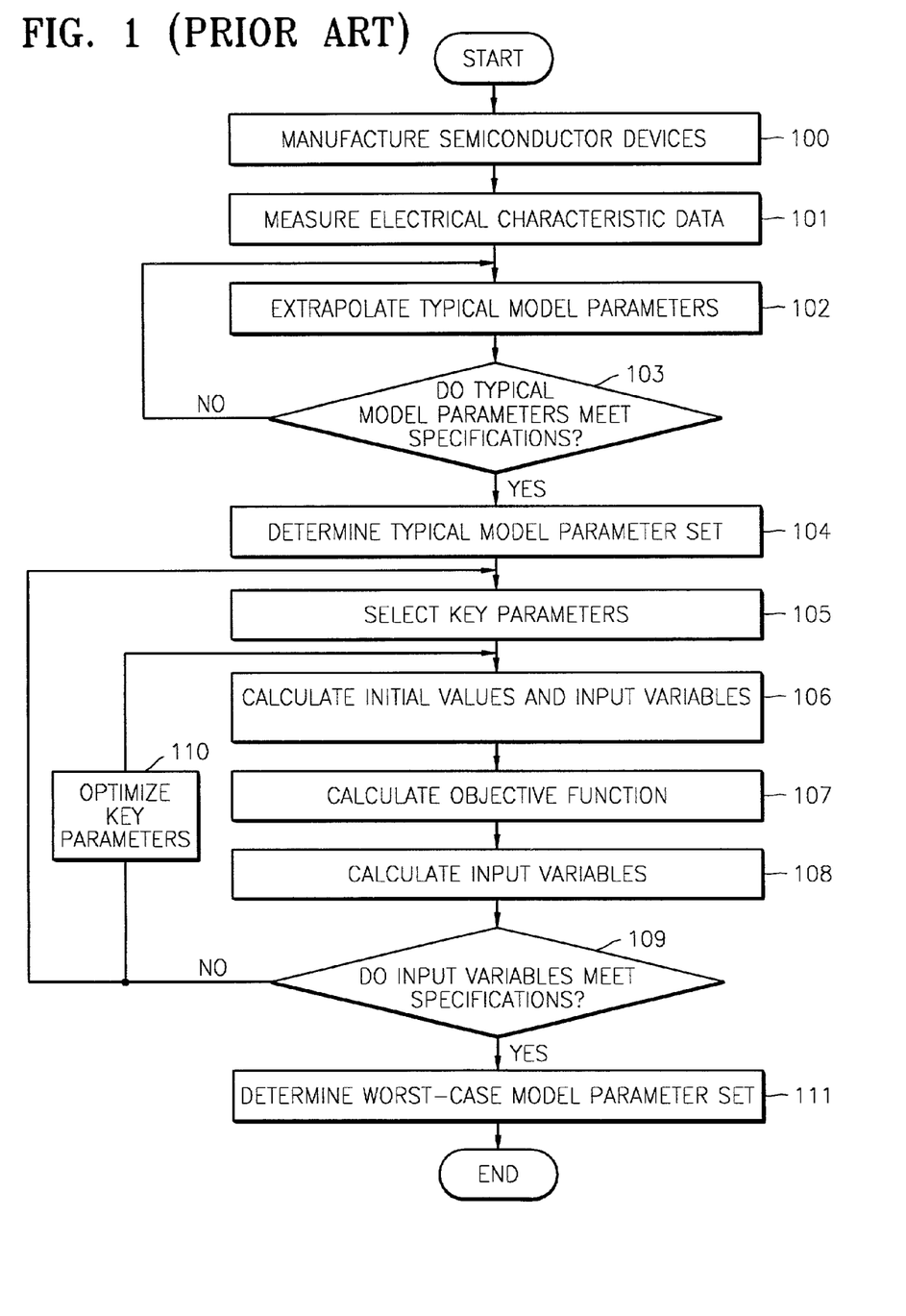
FIG. 1 is a flowchart of a conventional method for extrapolating Simulation Program with Integrated Circuit Emphasis (SPICE) model parameters.

FIG. 1 is a flowchart of a conventional method for extrapolating SPICE model parameters. Referring to FIG. 1, the method includes manufacturing semiconductor devices in step 100; measuring typical data, worst-case data, and best-case electrical characteristic data of the manufactured devices in step 101; extrapolating model parameters using the typical data measured in step 101 in step 102; determining whether the model parameters extrapolated in step 102 satisfy predetermined specifications in step 103 and executing step 102 if it is determined that the model parameters do not satisfy the specifications; determining a set of typical SPICE model parameters in step 104 if it is determined that the extrapolated model parameters satisfy the specifications in step 103; selecting key parameters using the worst-case data and typical data measured in step 101 in step 105; calculating initial values and input variables in step 106; calculating an objective function using the key parameters, initial values, and input variables in step 107; calculating input variables that change according to the results of the calculation performed in step 107 in step 108; determining whether the input variables obtained as the result of the calculation performed in step 108 meet the specifications in step 109 and executing step 105 or 106 after optimizing the key parameters in step 110, if it is determined that the input variables do not meet the specifications; and determining a set of worst-case SPICE model parameters in step 111 if it is determined that the input variables meet the specifications in step 109.

The conventional method described above requires step 105 of selecting key parameters and step 110 of optimizing the key parameters in order to determine a set of worst-case SPICE model parameters. These two steps 105 and 110 require significant processing time. Moreover, the conventional method has a limit to fitting worst-case model parameters to the worst-case electrical characteristics of a key device.

SUMMARY OF THE INVENTION

To solve the problems described above, it is a feature of an embodiment of the present invention to provide a simple and improved method for extrapolating Simulation Program with Integrated Circuit Emphasis (SPICE) model parameters that allow the result of simulating the worst-case dispersion of semiconductor devices to be accurately fitted to the worst-case dispersion of actual manufactured semiconductor devices.

To provide this and other features of the present invention, there is provided a method for extrapolating SPICE model parameters. The method includes manufacturing semiconductor devices; measuring typical data and worst-case data with respect to various electrical characteristics of the manufactured devices; determining a set of typical SPICE model parameters using the typical data, preferably by: extrapolating preliminary model parameters using the typical data, determining whether the extrapolated preliminary model parameters meet predetermined specifications and extrapolating preliminary model parameters if it is determined that extrapolated preliminary model parameters do not meet the predetermined specifications, determining the set of typical SPICE model parameters when it is determined that the extrapolated preliminary model parameters meet the predetermined specifications; determining a set of worst-case SPICE model parameters using the typical data and the worst-case data, preferably by: extrapolating preliminary statistical model parameters using the typical data and the worst-case data, determining whether the extrapolated preliminary statistical model parameters meet predetermined specifications and extrapolating preliminary statistical model parameters if it is determined that the extrapolated preliminary statistical model parameters do not meet the predetermined specifications, determining a set of statistical model parameters when it is determined that the extrapolated preliminary statistical model parameters meet the predetermined specifications in the previous step, and determining the set of worst-case SPICE model parameters considering a set of the typical SPICE model parameters and a set of the statistical model parameters.

Preferably, extrapolating preliminary statistical model parameters using the typical data and the worst-case data includes extrapolating preliminary statistical model parameters for threshold voltage, and extrapolating preliminary statistical model parameters for saturation current.

Preferably, extrapolating preliminary statistical model parameters for threshold voltage includes generating a plurality of threshold voltage data by subtracting typical data of threshold voltage from worst-case data of the threshold voltage, and defining a first function including all of the plurality of threshold voltage data.

Preferably, extrapolating preliminary statistical model parameters for saturation current includes generating a plurality of saturation current data by dividing typical data of saturation current by worst-case data of the saturation current, and defining a second function including all of the plurality of data of saturation current.

Preferably, considering the set of the typical SPICE model parameters and the set of the statistical model parameters, determining a set of worst-case SPICE model parameters includes determining a set of worst-case SPICE model parameters for threshold voltage, and determining a set of worst-case SPICE model parameters for saturation current.

Preferably, determining a set of worst-case SPICE model parameters for threshold voltage, the resulting values of adding the typical data for threshold voltage to the first function are defined as the set of worst-case SPICE model parameters for threshold voltage.

Preferably, determining a set of worst-case SPICE model parameters for saturation current, the resulting values of multiplying the typical data for saturation current by the second function are defined as the set of worst-case SPICE model parameters for saturation current.

BRIEF DESCRIPTION OF THE DRAWINGS

The above features and advantages of the present invention will become more apparent by describing in detail a preferred embodiment thereof with reference to the attached drawings in which.

DETAILED DESCRIPTION OF THE INVENTION

Korean patent application number 2001-19947, filed on Apr. 13, 2001, and entitled: "Improved Method for Extrapolating Model Parameters of SPICE," is incorporated by reference herein in its entirety.

Hereinafter, a preferred embodiment of the present invention will be described in detail with reference to the accompanying drawings. Like reference numerals refer to like elements throughout.

Figure 2:
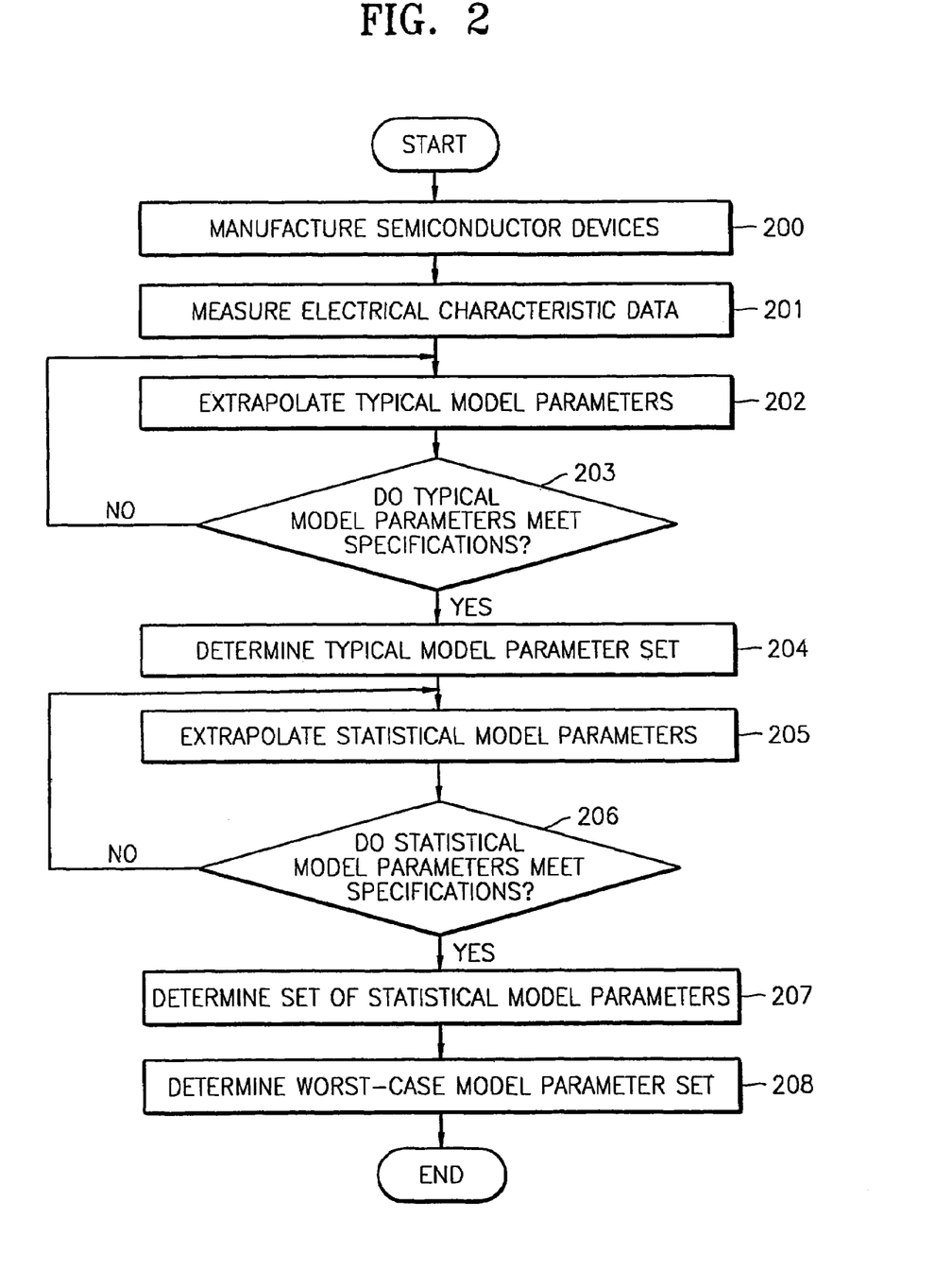
FIG. 2 is a flowchart of an improved method for extrapolating SPICE model parameters according to the present invention.

Referring to FIG. 2, an improved method for extrapolating model parameters according to an embodiment of the present invention includes, in step 200, manufacturing semiconductor devices; in step 201, measuring typical data and worst-case data with respect to various electrical characteristics of the manufactured devices; in step 202, determining a set of typical SPICE model parameters using the typical data, preferably by: extrapolating preliminary model parameters using the typical data; in step 203, determining whether the preliminary model parameters meet predetermined specifications and executing step 202 if it is determined that they do not; in step 204, determining a set of typical Simulation Program with Integrated Circuit Emphasis (SPICE) model parameters if it is determined that the preliminary model parameters meet the predetermined specifications in step 203; in step 205, determining a set of worst-case SPICE model parameters using the typical data and the worst-case data, preferably by: extrapolating preliminary statistical model parameters using the typical data and the worst-case data; in step 206, determining whether the preliminary statistical model parameters meet predetermined specifications and executing step 205 if it is determined that they do not; in step 207, determining a set of statistical model parameters if it is determined that the preliminary statistical model parameters meet the predetermined specifications in step 206; and in step 208, determining a set of worst-case SPICE model parameters by adding the set of typical SPICE model parameters determined in step 204 to the set of statistical model parameters determined in step 207.

As described above, an improved method for extrapolating SPICE model parameters according to the present invention is similar to a conventional method from the start to step 104 (or 204) of determining a set of typical SPICE model parameters. However, since the present invention uses a method for adding a set of statistical model parameters in order to realize an accurate worst-case dispersion, step 105 of selecting key parameters used in the conventional method is not necessary. In addition, the set of SPICE statistical model parameters to be added is not limited in the number of data, so it may be fitted to the worst-case dispersion.

Figure 3A:
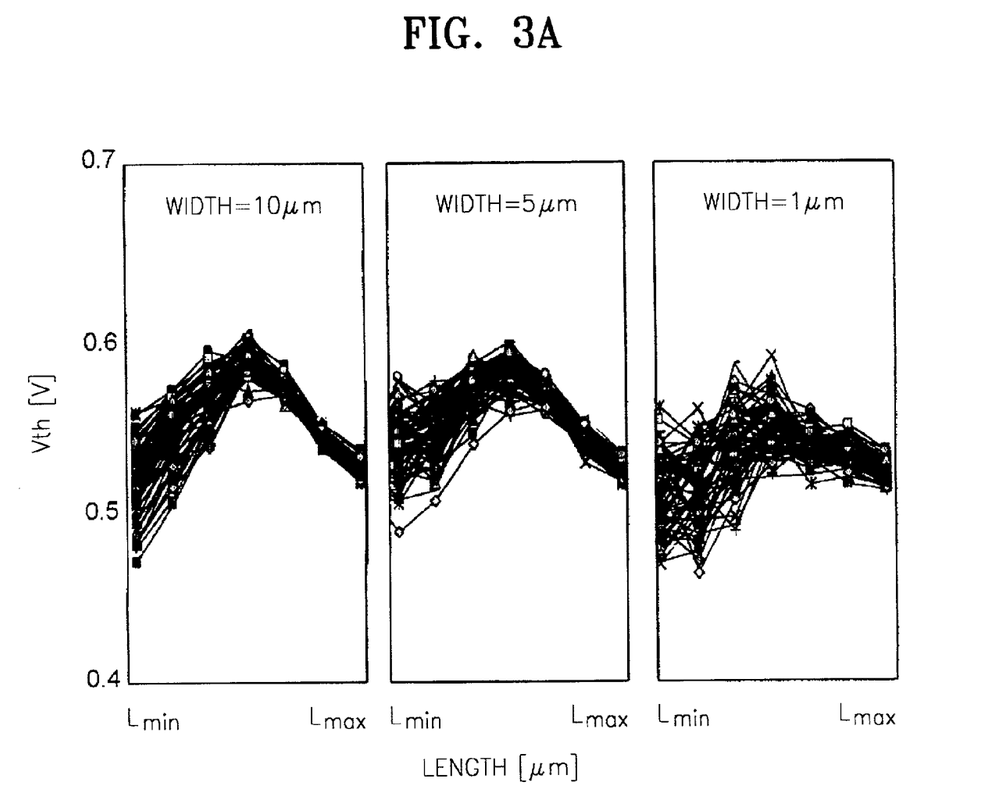
FIGS. 3A and 3B are graphs of threshold voltages of NMOS transistors with respect to dispersion.
Figure 3B:
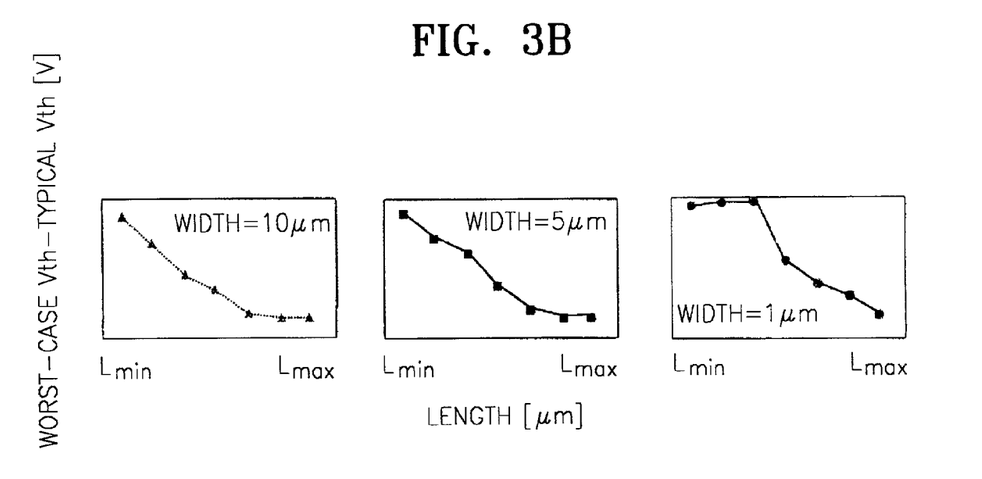

FIGS. 3A and 3B are graphs of threshold voltages of NMOS transistors with respect to dispersion. FIG. 3A shows threshold voltages Vth for NMOS transistors having gate widths of 10, 5 and 1 μm. Here, a best-case is when the threshold voltage Vth is low, and a worst-case is when the threshold voltage Vth is high. The intermediary between the best-case and the worst-case is referred to as a typical case. As the gate length or gate width of an NMOS transistor decreases, the difference between a best-case threshold voltage and a worst-case threshold voltage increases.

FIG. 3B shows the case where a typical threshold voltage is subtracted from a worst-case threshold voltage with respect to one arbitrary device in each case shown in FIG. 3A. As the gate length of the NMOS transistor in each case shown in FIG. 3A decreases, the difference between the best-case threshold voltage and the worst-case threshold voltage increases.

Figure 4:
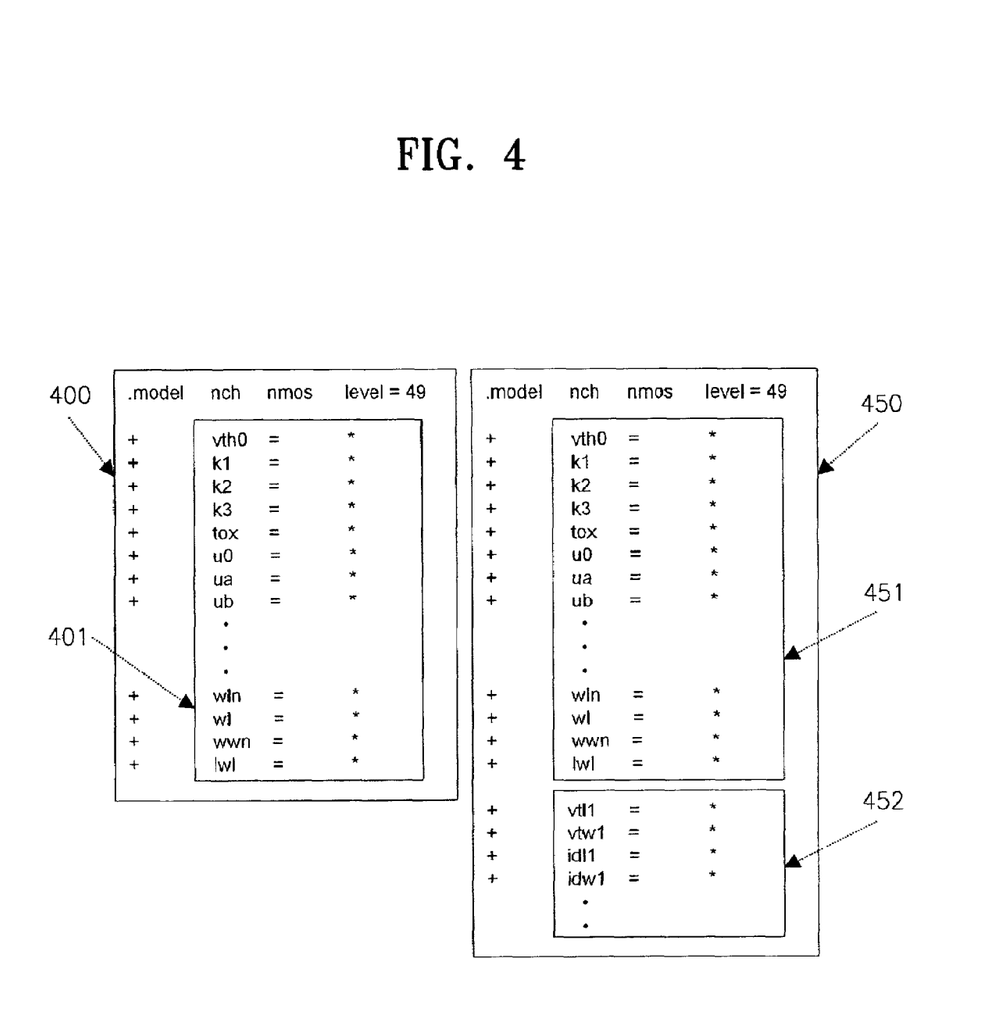
FIG. 4 is a diagram of a file format of SPICE model parameters determined according to a method of the present invention.

FIG. 4 is a diagram of a file format of SPICE model parameters determined according to a method of an embodiment of the present invention. Referring to FIG. 4, a file 400 shows a set of typical SPICE model parameters 401, and a file 450 shows a set of worst-case SPICE model parameters in which a set of statistical model parameters 452 is added to a set of typical SPICE model parameters 451.

The following description concerns a method for extrapolating statistical model parameters for the threshold voltage Vth and saturation current Idsat of a transistor and applying the statistical model parameters to a BSIM3 model.

Figure 5:
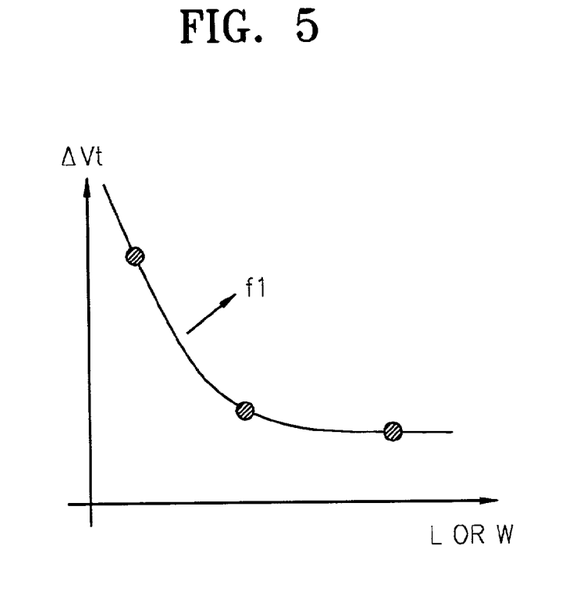
FIG. 5 is a graph of a method for extrapolating statistical model parameters for the threshold voltage of a transistor in accordance with an embodiment of the present invention.

FIG. 5 is a diagram of a method for extrapolating statistical model parameters for the threshold voltage of a transistor. Referring to FIG. 5, hatched circles denote a value obtained by subtracting a typical threshold voltage typical Vth(W,L) from a worst-case threshold voltage worst-case Vth(W,L) and is defined as a statistical model parameter $\Delta$Vth(W,L) for the threshold voltage Vth. This value varies with the gate length L and gate width W of the transistor. A curve drawn along the hatched circles may be defined as a predetermined function f1 including all statistical model parameters. The statistical model parameter $\Delta$Vth(WL) for the threshold voltage Vth is expressed by Equation (1), and the function f1 is expressed by Equation (2).

$$\Delta \text{Vth}(W,L) = \{\text{worst-case Vth}(W,L)\} - \text{typical Vth} \quad (1)$$

$$f1(W,L,vtl1,vtw1,\ldots) = \Delta \text{Vth}(W,L) \quad (2)$$

Here, vtl1 and vtw1 are defined as the coefficients of the respective statistical model parameters.

Equation (3) expresses a SPICE model parameter Vth0N(W,L) for a threshold voltage applied to a simulation to obtain dispersion.

$$\Delta \text{Vth0N}(W,L) = \Delta \text{Vth0}(W,L) + f1(W,L,vhl1,vtw1,\ldots) \quad (3)$$

Here, Vth0(W,L) indicates the threshold voltage of a typical SPICE model parameter.

Figure 6:
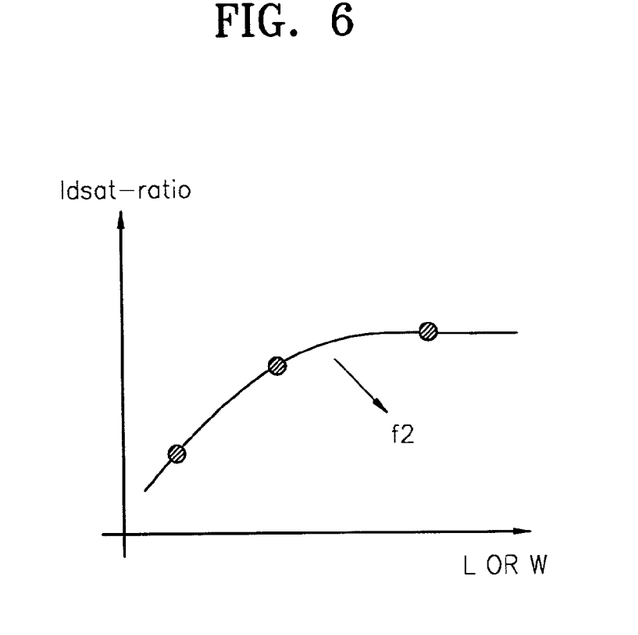
FIG. 6 is a graph of a method for extrapolating statistical model parameters for the saturation current of a transistor in accordance with an embodiment of the present invention.

FIG. 6 is a diagram of a method for extrapolating statistical model parameters for the saturation current Idsat of a transistor. Referring to FIG. 6, each hatched circle denotes the saturation current ratio Idsat-ratio, that is, a value obtained by dividing a simulation saturation current Idsat0 by worst-case Idsat(W,L). This value varies with the gate length L and gate width W of the transistor. A curve drawn along the hatched circles may be defined as a predetermined function f2 including all saturation current ratios Idsat-ratio. The saturation current ratio Idsat-ratio is expressed by Equation (4), and the function f2 is expressed by Equation (5).

$$\text{Idsat-ratio}(W, L) = \frac{\text{Idsat0}(W, L)}{\text{worst-case Idsat}(W, L)} \quad (4)$$

Here, Idsat0(W,L) indicates a simulated saturation current obtained by applying Vth0N(W,L) to a set of typical SPICE model parameters.

$$f2(W,L,idl1,idw1,\ldots) = \text{Idsat-ratio}(W,L) \quad (5)$$

Here, idl1 and idw1 are defined as the coefficients of the respective statistical model parameters.

A model parameter for saturation current Ids(W,L) used for simulating dispersion characteristics is expressed by Equation (6).

$$\text{Ids}(W,L) = \text{Ids0}(W,L) \times f2(W,L,idl1,idw1,\ldots) \quad (6)$$

Here, Ids0(W,L) indicates simulated normal current obtained by applying Vth0N(W,L) to a set of typical SPICE model parameters.

A method for extrapolating statistical model parameters for a threshold voltage and saturation current according to the present invention will be described with reference to FIGS. 5 and 6 and Equations (1) through (6). In order to extrapolate statistical model parameters for the threshold voltage, first, a statistical model parameter for threshold voltage $\Delta$Vth(W,L) is calculated by subtracting a typical threshold voltage typical Vth(W,L) from a worst-case threshold voltage worst-case Vth(W,L). Next, a function f1 including all data $\Delta$Vth(W,L) is defined.

To extrapolate statistical model parameters for the saturation current, first, a saturation current ratio Idsat-ratio(W,L) is calculated by dividing a set of typical model parameters for simulated saturation current, Idsat0(W,L), by a set of worst-case model parameters for saturation current, worst-case Idsat(W,L). Next, a model parameter for saturation current Ids(W,L) applied to a simulation to obtain dispersion is calculated by multiplying simulated normal current Ids0(W,L) with a function f2(W,L,idl1,idw1,...).

As described above, a method for extrapolating SPICE model parameters according to the present invention facilitates extrapolation of statistical model parameters, which is not performed in the conventional method. In addition, a set of worst-case SPICE model parameters produced using the extrapolated statistical model parameters is capable of realizing worst-case dispersion characteristics accurately.

A preferred embodiment of the present invention has been disclosed herein and, although specific terms are employed, they are used in a generic and descriptive sense only and not for the purpose of limitation. Accordingly, it will be understood by those of ordinary skill in the art that various changes in form and details may be made without departing from the spirit and scope of the present invention as set forth in the following claims.

What is claimed is:

1. A method for extrapolating Simulation Program with Integrated Circuit Emphasis (SPICE) model parameters in order to simulate operation and performance of semiconductor devices, comprising:
   measuring typical data and worst-case data with respect to various electrical characteristics of manufactured semiconductor devices;
   determining a set of typical SPICE model parameters using the typical data;
   determining a set of statistical model parameters using the typical data and the worst-case data;
   determining a set of worst-case SPICE model parameters using the set of typical SPICE model parameters and the set of statistical model parameters; and
   storing at least one of the determined set of statistical model parameters and the determined set of worst case SPICE model parameters on a computer readable recording medium, wherein each statistical model parameter of the statistical model parameter set is based on at least one of a difference and a ratio between the typical data and the worst-case data.

2. The method as claimed in claim 1, wherein determining the set of typical SPICE model parameters comprises:

extrapolating preliminary model parameters using the typical data;

determining whether the extrapolated preliminary model parameters meet predetermined specifications and extrapolating preliminary model parameters if it is determined that extrapolated preliminary model parameters do not meet the predetermined specifications; and determining the set of typical SPICE model parameters when it is determined that the extrapolated preliminary model parameters meet the predetermined specification.

3. The method as claimed in claim 1, wherein determining the set of statistical model parameters comprises:

extrapolating preliminary statistical model parameters using the typical data and the worst-case data;

determining whether the extrapolated preliminary statistical model parameters meet predetermined specifications and extrapolating preliminary statistical model parameters if it is determined that the extrapolated preliminary statistical model parameters do not meet the predetermined specifications; and determining the set of statistical model parameters when it is determined that the extrapolated preliminary statistical model parameters meet the predetermined specifications in the previous step.

4. The method as claimed in claim 3, wherein extrapolating preliminary statistical model parameters comprises:

extrapolating preliminary statistical model parameters for threshold voltage; and extrapolating preliminary statistical model parameters for saturation current.

5. The method as claimed in claim 1, wherein each statistical model parameter of the statistical model parameter set is based on a difference between the typical data and the worst-case data.

6. The method as claimed in claim 1, wherein each statistical model parameter of the statistical model parameter set is based on a ratio between the typical data and the worst-case data.

7. The method as claimed in claim 1, wherein the step of storing comprises storing the determined set of statistical model parameters on the computer readable recording medium.

8. The method as claimed in claim 1, wherein the step of storing comprises storing the determined set of worst case SPICE model parameters on the computer readable recording medium.

9. The method as claimed in claim 1, wherein the step of storing comprises storing the determined set of worst case SPICE model parameters and the determined set of statistical model parameters on the computer readable recording medium, the stored determined set of worst case SPICE model parameters and the determined set of statistical model parameters being employable for simulating operation and performance of semiconductor devices.

10. A method for extrapolating Simulation Program with Integrated Circuit Emphasis (SPICE) model parameters in order to simulate operation and performance of semiconductor devices, comprising:

measuring typical data and worst-case data with respect to various electrical characteristics of manufactured semiconductor devices;

determining a set of typical SPICE model parameters using the typical data;

determining a set of statistical model parameters using the typical data and the worst-case data;

determining a set of worst-case SPICE model parameters using the set of typical SPICE model parameters and the set of statistical model parameters; and storing at least one of the determined set of statistical model parameters and the determined set of worst case SPICE model parameters on a computer readable recording medium, wherein:

determining the set of statistical model parameters includes:

extrapolating preliminary statistical model parameters using the typical data and the worst-case data;

determining whether the extrapolated preliminary statistical model parameters meet predetermined specifications and extrapolating preliminary statistical model parameters if it is determined that the extrapolated preliminary statistical model parameters do not meet the predetermined specifications; and determining the set of statistical model parameters when it is determined that the extrapolated preliminary statistical model parameters meet the predetermined specifications in the previous step, extrapolating preliminary statistical model parameters includes:

extrapolating preliminary statistical model parameters for threshold voltage; and extrapolating preliminary statistical model parameters for saturation current, and extrapolating preliminary statistical model parameters for threshold voltage includes:

generating a plurality of threshold voltage data by subtracting typical data of threshold voltage from worst-case data of threshold voltage; and defining a first function including all of the plurality of threshold voltage data.

11. The method as claimed in claim 10, wherein determining the set of worst-case SPICE model parameters comprises:

determining a set of worst-case SPICE model parameters for threshold voltage; and determining a set of worst-case SPICE model parameters for saturation current.

12. The method as claimed in claim 11, wherein determining the set of worst-case SPICE model parameters for threshold voltage comprises-adding the typical data for threshold voltage and the first function.

13. The method as claimed in claim 11, wherein determining the set of worst-case SPICE model parameters for saturation current comprises multiplying the typical data for saturation current and the second function.

14. The method as claimed in claim 10, wherein the step of storing comprises at least one of storing the determined set of statistical model parameters and the determined set of worst case SPICE model parameters on the computer readable recording medium.

15. A method for extrapolating Simulation Program with Integrated Circuit Emphasis (SPICE) model parameters in order to simulate operation and performance of semiconductor devices, comprising:

measuring typical data and worst-case data with respect to various electrical characteristics of manufactured semiconductor devices;

determining a set of typical SPICE model parameters using the typical data;

determining a set of statistical model parameters using the typical data and the worst-case data;

determining a set of worst-case SPICE model parameters using the set of typical SPICE model parameters and the set of statistical model parameters; and storing at least one of the determined set of statistical model parameters and the determined set of worst case SPICE model parameters on a computer readable recording medium, wherein:

determining the set of statistical model parameters includes:

extrapolating preliminary statistical model parameters using the typical data and the worst-case data;

determining whether the extrapolated preliminary statistical model parameters meet predetermined specifications and extrapolating preliminary statistical model parameters if it is determined that the extrapolated preliminary statistical model parameters do not meet the predetermined specifications; and determining the set of statistical model parameters when it is determined that the extrapolated preliminary statistical model parameters meet the predetermined specifications in the previous step, extrapolating preliminary statistical model parameters includes:

extrapolating preliminary statistical model parameters for threshold voltage; and extrapolating preliminary statistical model parameters for saturation current, and extrapolating preliminary statistical model parameters for saturation current includes:

generating a plurality of saturation current data by dividing typical data of saturation current by worst-case data of saturation current; and defining a second function including all of the plurality of saturation current data.

16. The method as claimed in claim 15, wherein determining the set of worst-case SPICE model parameters comprises:

determining a set of worst-case SPICE model parameters for threshold voltage; and determining a set of worst-case SPICE model parameters for saturation current.

17. The method as claimed in claim 16, wherein determining the set of worst-case SPICE model parameters for threshold voltage comprises adding the typical data for threshold voltage and the first function.

18. The method as claimed in claim 16, wherein determining the set of worst-case SPICE model parameters for saturation current comprises multiplying the typical data for saturation current and the second function.

19. The method as claimed in claim 15, wherein the step of storing comprises at least one of storing the determined set of statistical model parameters and the determined set of worst case SPICE model parameters on the computer readable recording medium.

* * * * *